(12) United States Patent
Abe

(10) Patent No.: US 8,035,125 B2
(45) Date of Patent: Oct. 11, 2011

(54) LIGHT-EMITTING APPARATUS AND METHOD OF MANUFACTURING THE SAME

(75) Inventor: Yoshinori Abe, Chiba (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 12/296,813

(22) PCT Filed: Apr. 12, 2007

(86) PCT No.: PCT/JP2007/058062
§ 371 (c)(1),
(2), (4) Date: Oct. 10, 2008

(87) PCT Pub. No.: WO2007/119782
PCT Pub. Date: Oct. 25, 2007

(65) Prior Publication Data
US 2009/0121253 A1    May 14, 2009

(30) Foreign Application Priority Data

Apr. 12, 2006  (JP) .................................. 2006-109619

(51) Int. Cl.
*H01L 33/00* (2010.01)
*H01L 33/62* (2010.01)
(52) U.S. Cl. ........... 257/99; 257/E33.056; 257/E33.066; 438/26
(58) Field of Classification Search .................. 257/99, 257/E33.011, E33.056, E33.066, E33.067; 438/26
See application file for complete search history.

(56) References Cited

U.S. PATENT DOCUMENTS

| 5,610,685 | A | * | 3/1997 | Aiba | 355/67 |
| 6,483,623 | B1 | | 11/2002 | Maruyama | |
| 6,586,874 | B1 | * | 7/2003 | Komoto et al. | 313/503 |
| 6,835,960 | B2 | * | 12/2004 | Lin et al. | 257/81 |
| 7,026,756 | B2 | * | 4/2006 | Shimizu et al. | 313/503 |
| 2003/0160259 | A1 | * | 8/2003 | Uemura | 257/99 |
| 2003/0230757 | A1 | * | 12/2003 | Suehiro et al. | 257/99 |
| 2005/0194609 | A1 | * | 9/2005 | Furukawa et al. | 257/100 |
| 2005/0253158 | A1 | * | 11/2005 | Yasukawa et al. | 257/98 |
| 2005/0277216 | A1 | * | 12/2005 | Asakawa | 438/22 |
| 2007/0262328 | A1 | * | 11/2007 | Bando | 257/79 |
| 2007/0298268 | A1 | * | 12/2007 | Haitko | 428/447 |
| 2008/0173890 | A1 | * | 7/2008 | Sung | 257/99 |

(Continued)

FOREIGN PATENT DOCUMENTS

CN             1474462  A  *  2/2004

(Continued)

*Primary Examiner* — Matthew Smith
*Assistant Examiner* — Michele Fan
(74) *Attorney, Agent, or Firm* — Sughrue Mion, PLLC

(57) ABSTRACT

The present invention provides a light-emitting apparatus capable of improving brightness and reducing power consumption and a method of manufacturing the same. The light-emitting apparatus includes: a light-emitting device 2 including electrode pads 9 and 10; and a lead frame 3 including electrode leads 11 and 12. The electrode pads 9 and 10 and the electrode leads 11 and 12 are electrically connected to each other by bonding wires 14 and 15, and the light-emitting device 2 is arranged with a gap H between the lead frame 3 and the light-emitting device 2. In this way, it is possible to effectively use light emitted from one surface of the light-emitting device 2 facing the lead frame 3. Therefore, it is possible to improve the utilization efficiency of light emitted from the light-emitting device 2.

6 Claims, 5 Drawing Sheets

U.S. PATENT DOCUMENTS

2009/0057698 A1 * 3/2009 Okamura et al. ............... 257/98

FOREIGN PATENT DOCUMENTS

| JP | 07307409 A * | 11/1995 |
| JP | 09-307145 A | 11/1997 |
| JP | 11026811 A * | 1/1999 |
| JP | 11-068166 A | 3/1999 |
| JP | 11-163411 A | 6/1999 |
| JP | 2001-119075 A | 4/2001 |
| JP | 2004-071710 A | 3/2004 |
| JP | 2005-530349 A | 10/2005 |
| JP | 2006-032804 A | 2/2006 |
| TW | 200601594 A | 1/2006 |
| WO | 03/107441 A2 | 12/2003 |

* cited by examiner

LIGHT-EMITTING APPARATUS AND METHOD OF MANUFACTURING THE SAME

TECHNICAL FIELD

The present invention relates to a light-emitting apparatus using a light-emitting device, such as a light emitting diode (LED), and a method of manufacturing the same.

Priority is claimed on Japanese Patent Application No. 2006-109619, filed Apr. 12, 2006, the content of which is incorporated herein by reference.

BACKGROUND ART

A light-emitting apparatus using a light-emitting device, such as an LED chip, has been proposed (for example, see Patent Document 1). The light-emitting apparatus has a structure in which an LED chip provided in a package is fixed to a lead frame by die bonding using paste and electrode pads of the LED chip and electrode leads of the lead frame are electrically connected to each other by wire bonding using bonding wires.

[Patent Document 1] JP-A-9-307145

DISCLOSURE OF THE INVENTION

Problem that the Invention is to Solve

The light-emitting apparatus can improve the utilization efficiency of light emitted from the LED chip that is provided in the package, and thus improve the brightness of light. When the utilization efficiency of light emitted from the LED chip is improved, it is possible to reduce the power required to obtain the same brightness. As a result, it is possible to reduce power consumption.

The present invention is contrived in order to solve the problems, and an object of the prevent invention is to provide a light-emitting apparatus capable of improving the utilization efficiency of light emitted from a light-emitting device to improve brightness and reduce power consumption, and a method of manufacturing the same.

Means for Solving the Problems

The inventors conducted examinations in order to solve the above problems. The examinations proved that, in the related art, since a light-emitting device was adhered to a lead frame by paste, it was difficult to effectively use light emitted from a surface of the light-emitting device facing the lead frame. Therefore, the inventors have found that it is possible to improve the utilization efficiency of light emitted from the light-emitting device by reflecting a large amount of light emitted from the surface of the light-emitting device facing the lead frame from the lead frame, by which leads to the present invention was achieved.

That is, the present invention provides the following.

According to a first aspect of the present invention, a light-emitting apparatus includes: a light-emitting device including electrode pads; and a lead frame including electrode leads. The electrode pads and the electrode leads are electrically connected to each other by bonding wires, and the light-emitting device is arranged with a gap between the lead frame and the light-emitting device.

According to a second aspect of the present invention, in the light-emitting apparatus according to the first aspect, preferably, the gap is in the range of 0.1 mm to 0.6 mm.

According to a third aspect of the present invention, in the light-emitting apparatus according to the first or second aspect, preferably, the bonding wires support the light-emitting device to be lifted up from the lead frame.

According to a fourth aspect of the present invention, in the light-emitting apparatus according to any one of the first to third aspects, preferably, a spacer transmitting light emitted from the light-emitting device is provided between the light-emitting device and the lead frame.

According to a fifth aspect of the present invention, preferably, the light-emitting apparatus according to any one of the first to fourth aspects further includes a package that holds the lead frame to which the light-emitting device is mounted. Preferably, a portion of the lead frame and the light-emitting device are exposed from a concave portion formed in the package.

According to a sixth aspect of the present invention, in the light-emitting apparatus according to any one of the first to fifth aspects, preferably, the light-emitting device includes a compound semiconductor obtained by sequentially laminating an n-type semiconductor layer, a light-emitting layer, and a p-type semiconductor layer on a substrate, and a first electrode pad connected to the n-type semiconductor layer and a second electrode pad connected to the p-type semiconductor layer are provided on one surface of the light-emitting device that is opposite to the lead frame.

According to a seventh aspect of the present invention, in the light-emitting apparatus according to the sixth aspect, preferably, the lead frame includes a first electrode lead and a second electrode lead, and the first electrode pad and the first electrode lead are electrically connected to each other by a first bonding wire, and the second electrode pad and the second electrode lead are electrically connected to each other by a second bonding wire. Preferably, a direction from a contact point between the first bonding wire and the first electrode pad to a contact point between the first bonding wire and the first electrode lead is opposite to a direction from a contact point between the second bonding wire and the second electrode pad and a contact point between the second bonding wire and the second electrode lead.

According to an eighth aspect of the present invention, there is provided a method of manufacturing a light-emitting apparatus including a light-emitting device having electrode pads and a lead frame having electrode leads, the electrode pads and the electrode leads being electrically connected to each other by bonding wires. The method includes: fixing the light-emitting device to the lead frame; electrically connecting the electrode pads and the electrode leads using the bonding wires; and detaching the fixed light-emitting device from the lead frame.

According to a ninth aspect of the present invention, preferably, the method of manufacturing a light-emitting apparatus according to the eighth aspect further includes: after detaching the light-emitting device from the lead frame, lifting the light-emitting device supported by the bonding wires up to a predetermined height. According to a tenth aspect of the present invention, there is provided a method of manufacturing a light-emitting apparatus including a light-emitting device having electrode pads and a lead frame having electrode leads, the electrode pads and the electrode leads being electrically connected to each other by bonding wires. The method includes: providing a spacer that transmits light emitted from the light-emitting device on the lead frame; fixing the light-emitting device to the spacer; and electrically connecting the electrode pads and the electrode leads using the bonding wires.

ADVANTAGES OF THE INVENTION

As described above, in the light-emitting apparatus according to the present invention, since a gap is provided between the light-emitting device and the lead frame, it is possible to reflect a large amount of light emitted from one surface of the light-emitting device facing the lead frame from the lead frame. Therefore, the light-emitting apparatus can effectively use light emitted from the surface of the light-emitting device facing the lead frame, and thus improve the utilization efficiency of light emitted from the light-emitting device. As a result, it is possible to improve brightness and reduce power consumption.

In the light-emitting apparatus according to the present invention, since the bonding wires support the light-emitting device to be lifted up from the lead frame, it is possible to provide a gap between the light-emitting device and the lead frame. Therefore, it is possible to reflect a large amount of light emitted from one surface of the light-emitting device facing the lead frame from the lead frame.

In addition, the gap is set to a value that enables the lead frame to most effectively reflect light emitted from the surface of the light-emitting device facing the lead frame. Therefore, it is preferable that the gap be greater than or equal to the thickness of the light-emitting device. Specifically, it is preferable that the gap be in the range of 0.1 mm to 0.6 mm.

Further, in the light-emitting apparatus according to the present invention, the spacer transmitting light emitted from the light-emitting device is provided between the light-emitting device and the lead frame. Therefore, it is possible to provide a gap between the light-emitting device and the lead frame. Since the spacer transmits light emitted from the light-emitting device, it is possible to reflect a large amount of light emitted from the surface of the light-emitting device facing the lead frame from the lead frame without shielding the light.

The light-emitting apparatus according to the present invention includes the package holding the lead frame to which the light-emitting device is mounted, and a portion of the lead frame and the light-emitting device are exposed from an opening formed in the package. Therefore, light from the light-emitting device can be effectively emitted from one surface of the light-emitting device that is opposite to the lead frame.

In the light-emitting apparatus according to the present invention, the light-emitting device includes a compound semiconductor obtained by sequentially laminating an n-type semiconductor layer, a light-emitting layer, and a p-type semiconductor layer on a substrate, and a first electrode pad connected to the n-type semiconductor layer and a second electrode pad connected to the p-type semiconductor layer are provided on one surface of the light-emitting device that is opposite to the lead frame. Therefore, the light-emitting device can be mounted in a so-called face-up manner by wire bonding.

In the light-emitting apparatus according to the present invention, preferably, the lead frame includes a first electrode lead and a second electrode lead. The first electrode pad and the first electrode lead are electrically connected to each other by the first bonding wire, and the second electrode pad and the second electrode lead are electrically connected to each other by the second bonding wire. The direction from a contact point between the first bonding wire and the first electrode pad to a contact point between the first bonding wire and the first electrode lead is opposite to the direction from a contact point between the second bonding wire and the second electrode pad and a contact point between the second bonding wire and the second electrode lead.

According to this structure, it is possible to stably support the light-emitting device using the first bonding wire and the second bonding wire such that it is lifted from the lead frame.

In a method of manufacturing a light-emitting apparatus according to the present invention, the light-emitting device is fixed to the lead frame, the electrode pads and the electrode leads are electrically connected to each other by the bonding wires, and the fixed light-emitting device is detached from the lead frame. In this way, it is possible to arrange the light-emitting device with a gap between the lead frame and one surface of the light-emitting device facing the lead frame.

According to the manufacturing method, it is possible to manufacture a light-emitting apparatus capable of reflecting a large amount of light emitted from the surface of the light-emitting device facing the lead frame from the lead frame, without shielding the light. In addition, in the light-emitting apparatus fabricated by the manufacturing method, it is possible to effectively use light emitted from the surface of the light-emitting device facing the lead frame. Therefore, it is possible to improve the utilization efficiency of light emitted from the light-emitting device. As a result, it is possible to improve the brightness and reduce power consumption.

In the method of manufacturing a light-emitting apparatus according to the present invention, after the light-emitting device is detached from the lead frame, the light-emitting device supported by the bonding wires can be lifted up to a predetermined height.

The predetermined height means a gap between the lead frame and the surface of the light-emitting device facing the lead frame where light emitted from the surface of the light-emitting device facing the lead frame can be most effectively reflected from the lead frame. It is preferable that the gap (height) be greater than or equal to the thickness of the light-emitting device. Specifically, it is preferable that the gap be in the range of 0.1 mm to 0.6 mm.

According to this structure, it is possible to lift the light-emitting device supported by the bonding wires up to a height where light emitted from the surface of the light-emitting device facing the lead frame can be most effectively reflected from the lead frame.

In a method of manufacturing a light-emitting apparatus according to the present invention, a spacer that transmits light emitted from a light-emitting device is provided on a lead frame, the light-emitting device is fixed to the spacer, and the electrode pads and the electrode leads are electrically connected to each other by the bonding wires. In this way, it is possible to provide a gap between the light-emitting device and the lead frame.

Therefore, according to the above-mentioned manufacturing method, since the spacer transmits light emitted from the light-emitting device, it is possible to manufacture a light-emitting apparatus capable of reflecting a large amount of light emitted from the surface of the light-emitting device facing the lead frame from the lead frame, without shielding the light. Therefore, the light-emitting apparatus fabricated by the above-mentioned manufacturing method can effectively use light emitted from the surface of the light-emitting device facing the lead frame, and it is possible to improve the utilization efficiency of light emitted from the light-emitting device. As a result, it is possible to improve the brightness and reduce power consumption.

BEST MODE FOR CARRYING OUT THE INVENTION

Figure 1:
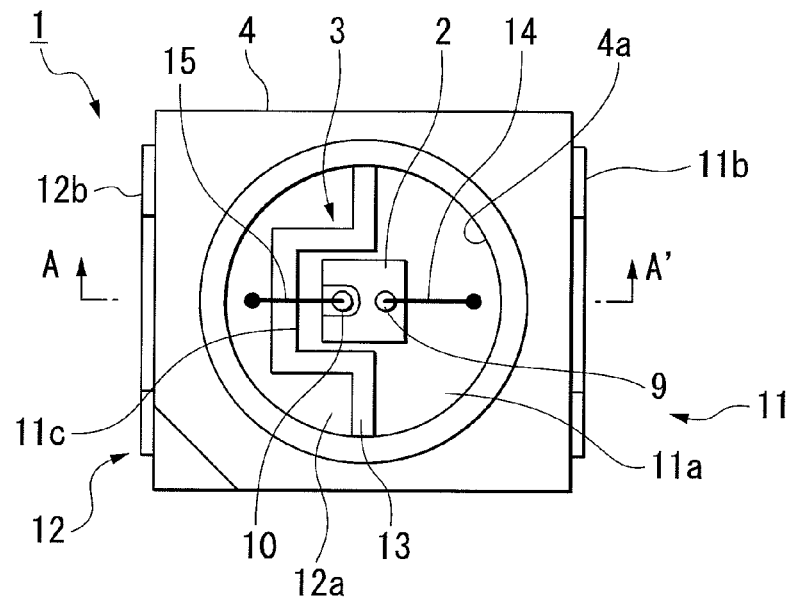
FIG. 1 is a plan view illustrating a light-emitting apparatus according to a first embodiment of the present invention.

Hereinafter, a light-emitting apparatus and a method of manufacturing the same according to exemplary embodiments of the present invention will be described with reference to the accompanying drawings. In the drawings, the dimensions of components are not equal to the actual dimensions, but the scale of each component is adjusted in order to have a recognizable size.

First Embodiment

First, a light-emitting apparatus 1 according to a first embodiment of the present invention will be described with reference to FIGS. 1 and 2.

The light-emitting apparatus 1 includes a light-emitting device 2, serving as a light source, a lead frame 3 to which the light-emitting device 2 is attached, and a package 4 accommodating the light-emitting device and the lead frame.

Figure 3:
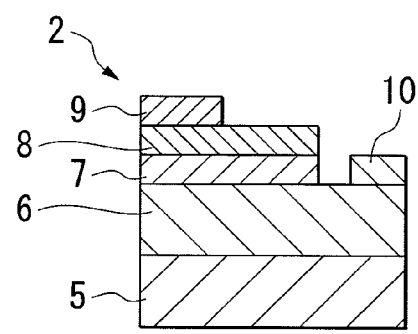
FIG. 3 is a cross-sectional view illustrating the structure of a light-emitting device.

As shown in FIG. 3, the light-emitting device 2 is an LED chip, which is a compound semiconductor formed by sequentially laminating an n-type semiconductor layer 6, a light-emitting layer 7, and a p-type semiconductor layer 8 on a substrate 5.

Among the components, the substrate 5 may be formed of a translucent substrate material, such as sapphire, SiC, or GaP. As the n-type semiconductor layer 6, the light-emitting layer 7, and the p-type semiconductor layer 8, compound semiconductors formed by laminating, for example, GaN, AlGaN, InGaN, AlInGaN, GaP, GaAlP, AlInGaP, InP, GaAs, AlGaAs, ZnS, ZnSe, and SiC may be formed on the substrate 5 by, for example, an MOCVD (metal organic chemical vapor deposition) method, an MBE (molecular beam epitaxy) method, or an HVPE (hydride vapor phase epitaxy) method. Therefore, it is possible to manufacture an LED lamp emitting light having various wavelengths (colors) by combining the compound semiconductors.

For example, a homo junction structure, such as PN junction, PIN junction, or MIS junction, or a hetero junction structure may be used as the structure of the compound semiconductors. In addition, a double hetero junction structure or a quantum well junction structure may be used in order to improve emission efficiency.

In the light-emitting device 2, a first electrode pad 9 that serves as a positive electrode and is connected to the p-type semiconductor layer 8 and a second electrode pad 10 that serves as a negative electrode and is connected to the n-type semiconductor layer 6 are provided on one surface that is opposite to the other surface (substrate 5) facing the lead frame 3.

Specifically, the first electrode pad 9 is provided on the p-type semiconductor layer 8, and the second electrode pad 10 is provided on a portion of the n-type semiconductor layer 6 that is formed by removing portions of the light-emitting layer 7 and the p-type semiconductor layer 8. In this way, the light-emitting device 2 can be mounted in a face-up manner. As shown in FIG. 1, the first electrode pad 9 and the second electrode pad 10 are arranged between two opposite sides of a rectangular light-emitting device 2 so as to be opposite to each other. Alternatively, the first electrode pad 9 and the second electrode pad 10 may be arranged so as to be opposite to two opposite corners of the light-emitting device 2.

The first electrode pad 9 and the second electrode pad 10 may be formed of, for example, Cr, Ti, or Au.

Figure 2:
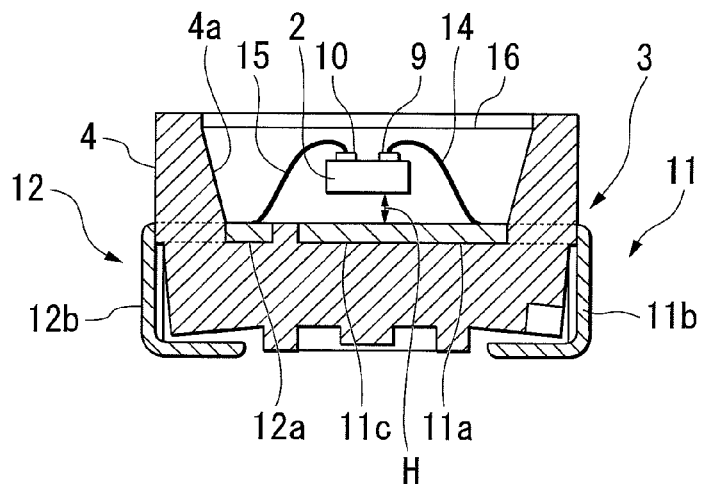
FIG. 2 is a cross-sectional view illustrating the light-emitting apparatus taken along the line A-A' of FIG. 1.

As shown in FIGS. 1 and 2, the lead frame 3 is for supplying power to the light-emitting device 2 from the outside, and includes a first electrode lead 11 connected to the first electrode pad 9 and a second electrode lead 12 connected to the second electrode pad 10.

The lead frame 3 may be formed of, for example, a Cu alloy including impurities such as Fe.

The first electrode lead 11 has an inside terminal 11a facing the inside of the package 4 at one end and an outside terminal 11b facing the outside of the package 4 at the other end. Similarly, the second electrode lead 12 has an inside terminal 12a facing the inside of the package 4 at one end and an outside terminal 12b facing the outside of the package 4 at the other end.

The inside terminal 11a of the first electrode lead 11 and the inside terminal 12a of the second electrode lead 12 are arranged on the bottom of a concave portion 4a that is formed at the center of the package 4, which will be described below, so as to be opposite to each other with an insulating region 13 interposed therebetween. The inside terminal 11a of the first electrode lead 11 forms a mounting portion 11c on which the light-emitting device 2 is arranged. The mounting portion 11c forms a portion of the inside terminal 11a that protrudes toward the second electrode lead 12, at the center of the bottom of the concave portion 4a.

The outside terminal 11b of the first electrode lead 11 and the outside terminal 12b of the second electrode lead 12 extend from two opposite side surfaces of the package 4 to the outside, and then bent along the side surface and the bottom of the package 4.

In the light-emitting apparatus 1, the light-emitting device 2 is arranged on the mounting portion 11c, the first electrode pad 9 and the inside terminal 11a of the first electrode lead 11 are electrically connected to each other by the first bonding wire 14, and the second electrode pad 10 and the second electrode lead 12 are electrically connected to each other by the second bonding wire 15.

The first bonding wire 14 and the second bonding wire 15 may be formed of, for example, Au, Al, or Cu.

The package 4 holds the lead frame 3 having the light-emitting device 2 attached thereto, and protects the light-emitting device 2 arranged in the package 4.

Specifically, the package 4 is formed of resin or glass by molding or insert molding together with the lead frame 3. The package 4 may be formed of a thermosetting resin or a thermoplastic resin, such as polycarbonate resin, polyphenylene sulfide (PPS), liquid crystal polymer (LCP), ABS resin, epoxy resin, phenolic resin, acrylic resin, PBT resin, glass epoxy resin, or polyphthalamide resin.

The package 4 is formed in a substantially rectangular parallelepiped shape, and the concave portion 4a is provided at the center of the upper surface of the package. The light-emitting device 2, the inside terminal 11a of the first electrode lead 11, and the inside terminal 12a of the second electrode lead 12 are exposed from the concave portion 4a. The concave portion 4a has a reflector (reflecting surface) shape whose diameter is increased from the bottom to an upper open portion in order to effectively emit light from the light-emitting device 2 to a surface opposite to the surface facing the lead frame 3.

The concave portion 4a of the package 4 is filled with a translucent sealing resin 16 in order to protect the light-emitting device 2 and the lead frame 3 exposed from the concave portion 4a from the external environment.

The sealing resin 16 may be a transparent resin that transmits light emitted from the light-emitting device 2, such as silicon resin, epoxy resin, allyl resin, or polyacrylate resin. In addition, an insulating material, such as glass or quartz, may be used for the sealing resin 16.

Further, in the light-emitting apparatus 1, the sealing resin 16 may include a phosphor. In this case, it is possible to emit light having a different color from that of light emitted from the light-emitting device 2. For example, it is possible to obtain white light by the combination of a blue LED and a yellow phosphor.

In the light-emitting apparatus 1 according to this embodiment of the present invention, as shown in FIG. 2, there is a gap H between the lead frame 3 and one surface of the light-emitting device 2 facing the lead frame 3. Specifically, in the light-emitting apparatus 1, the first bonding wire 14 and the second bonding wire 15 support the light-emitting device 2 with a predetermined gap H between the light-emitting device 2 and the lead frame 3.

The gap H between the light-emitting device 2 and the lead frame 3 is set to a value that enables the lead frame 3 to most effectively reflect light emitted from the surface of the light-emitting device 2 facing the lead frame 3. Specifically, it is preferable that the gap H be greater than or equal to the thickness of the light-emitting device 2. In addition, the gap is preferably greater than or equal to half the depth of the concave portion 4a of the package 4, and it is preferable to arrange the light-emitting device 2 at the focus of an emission surface on which the concave portion 4a of the package 4 is formed. The upper limit of the gap H is preferably set such that the light-emitting device 2 does not protrude from the concave portion 4a of the package 4. Specifically, it is preferable that the gap H be in the range of 0.1 mm to 0.6 mm.

In the related art, since the light-emitting device 2 is adhered to the lead frame 3 by paste, the gap H between the light-emitting device 2 and the lead frame 3 is equal to the thickness of the paste. In this case, it is difficult to reflect a large amount of light emitted from the surface of the light-emitting device 2 facing the lead frame 3 from the lead frame 3.

In contrast, in the light-emitting apparatus 1 according to this embodiment of the present invention, the gap H between the light-emitting device 2 and the lead frame 3 is set to be greater than or equal to the thickness of the light-emitting device 2. In this way, it is possible to reflect a large amount of light emitted from the surface of the light-emitting device 2 facing the lead frame 3 from the lead frame 3. Therefore, the light-emitting apparatus 1 can effectively use light emitted from the surface of the light-emitting device 2 facing the lead frame 3, and improve the utilization efficiency of light emitted from the light-emitting device 2. As a result, it is possible to improve the brightness of light and reduce power consumption.

In the light-emitting apparatus 1 according to this embodiment of the present invention, it is preferable that a direction from a contact point between the first bonding wire 14 and the first electrode pad 9 to a contact point between the first bonding wire 14 and the first electrode lead 11 be opposite to a direction from a contact point between the second bonding wire 15 and the second electrode pad 10 and a contact point between the second bonding wire 15 and the second electrode lead 12.

In this case, the first bonding wire 14 and the second bonding wire 15 can stably support the light-emitting device 2 with a predetermined gap between the light-emitting device 2 and the lead frame 3.

Further, in the light-emitting apparatus 1 according to this embodiment of the present invention, the concave portion 4a of the package 4 in which the light-emitting device 2 is arranged is filled with the sealing resin 16. Therefore, it is possible to firmly fix the light-emitting device 2 to the package 4.

Next, a method of manufacturing the light-emitting apparatus 1 will be described.

In order to manufacture the light-emitting apparatus 1, first, the light-emitting device 2 is prepared. Specifically, the light-emitting device 2 is manufactured as follows. The n-type semiconductor layer 6, the light-emitting layer 7, and the p-type semiconductor layer 8 are sequentially formed on the substrate 5 by, for example, an MOCVD (metal organic chemical vapor deposition) method, an MBE (molecular beam epitaxy) method, or an HVPE (hydride vapor phase epitaxy) method to manufacture a compound semiconductor. Then, the first electrode pad 9 and the second electrode pad 10 are formed on the n-type semiconductor layer 6 and the p-type semiconductor layer 8 by, for example, a photolithography technique or a lift-off technique.

Figure 4:
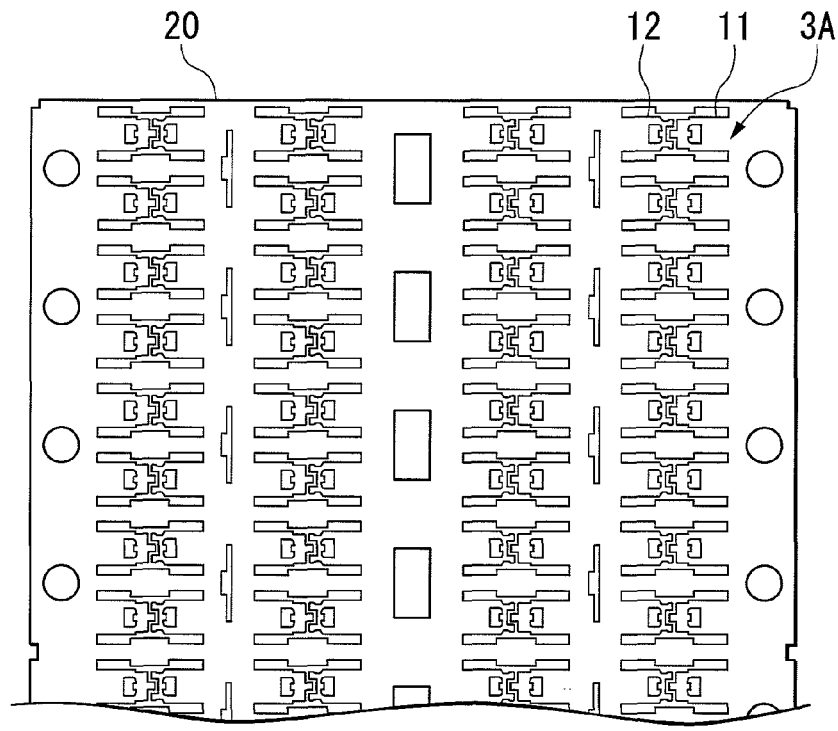
FIG. 4 is a plan view illustrating a frame plate.
Figure 5:
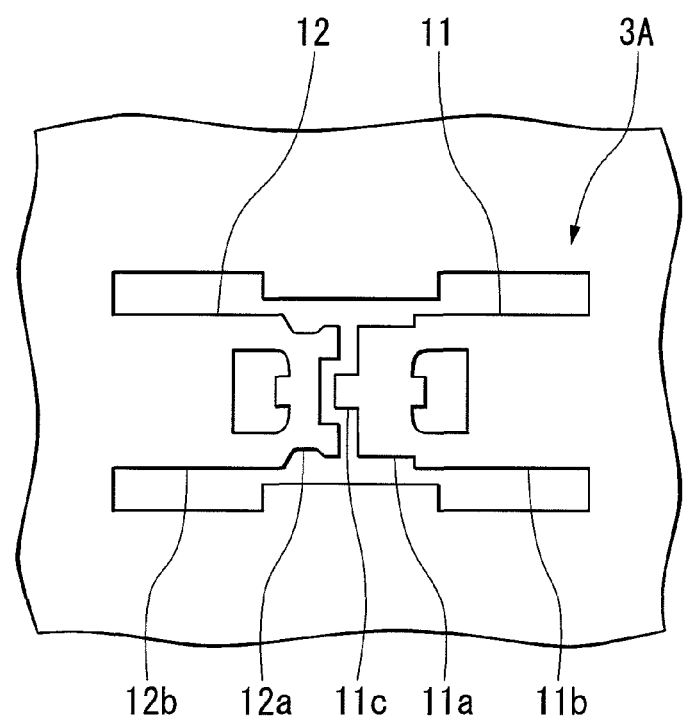
FIG. 5 is an enlarged plan view illustrating a portion of the frame plate shown in FIG. 4.

In order to manufacture the light-emitting apparatus 1, as shown in FIGS. 4 and 5, a frame plate 20 having a plurality of portions 3A corresponding to the lead frames 3 arranged in a matrix thereon is prepared. Specifically, in the frame plate 20, a plurality of portions 3A corresponding to the lead frames 3 in which portions corresponding to the first electrode leads 11 and the second electrode leads 12 are punched out are arranged in a matrix.

Figure 6:
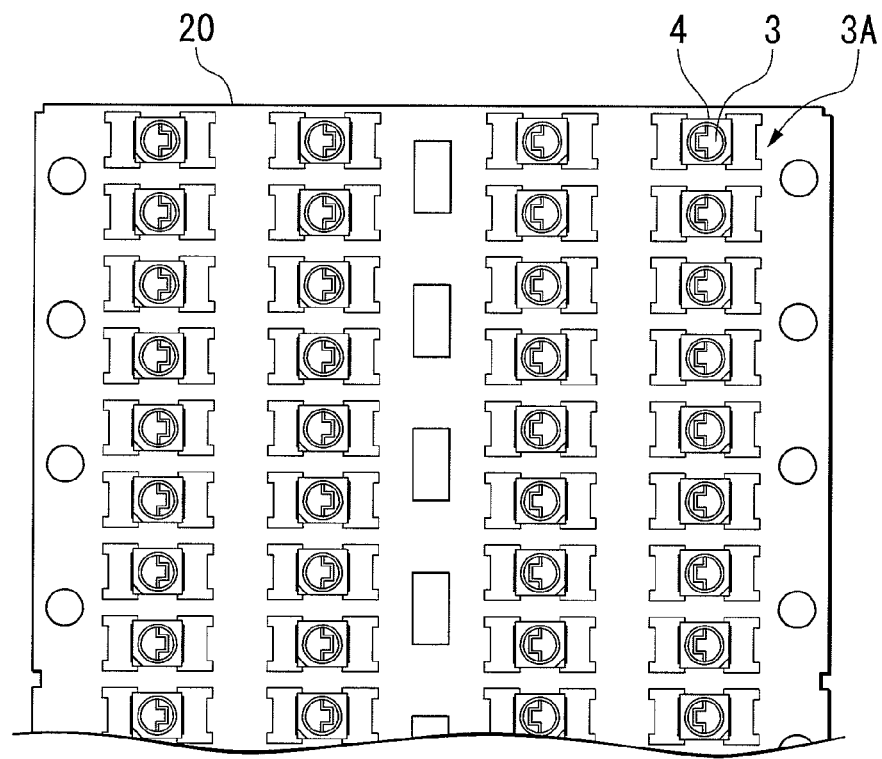
FIG. 6 is a plan view illustrating the frame plate having packages arranged thereon.
Figure 7:
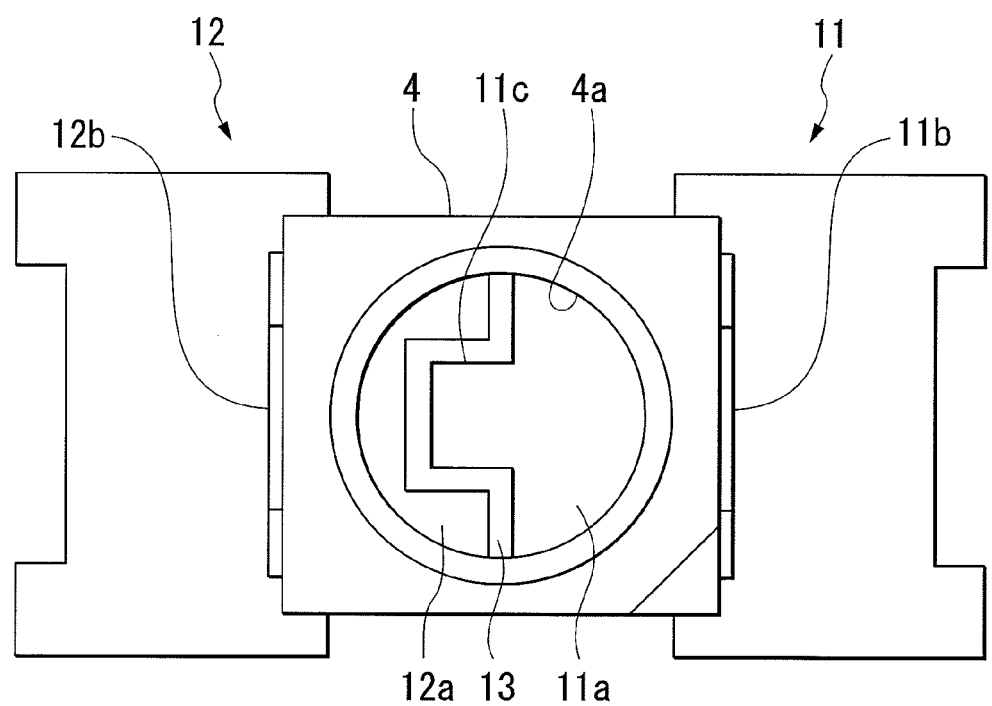
FIG. 7 is an enlarged plan view illustrating a portion of the frame plate shown in FIG. 6.

Then, as shown in FIGS. 6 and 7, the portions 3A of the frame plate 20 corresponding to the lead frames 3 are molded with resin to form the packages 4 each having the concave portion 4a at the center. After the package 4 is formed, portions corresponding to the outside terminal 11b of the first electrode lead 11 and the outside terminal 12b of the second electrode lead 12 are bent along the side surface and the bottom of the package 4.

Figure 8:
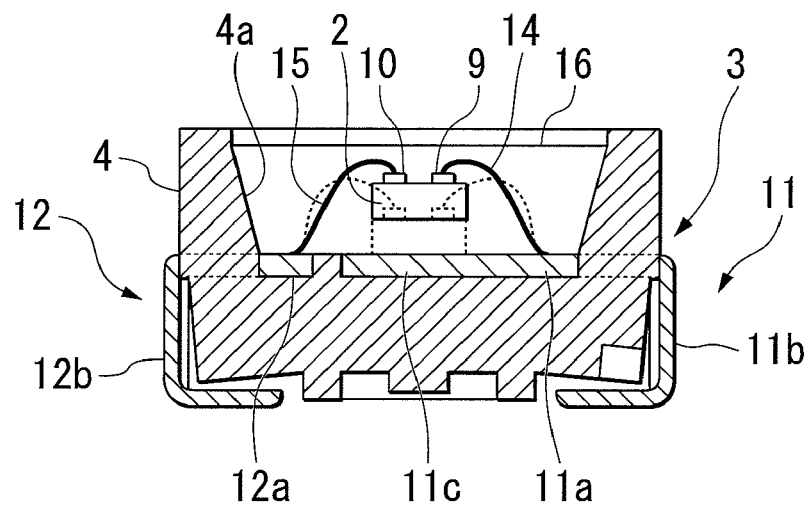
FIG. 8 is a cross-sectional view illustrating the lifted state of the wire-bonded light-emitting device.

Then, as represented by a virtual line in FIG. 8, the light-emitting device 2 is fixed to a portion of the frame plate 20 corresponding to the mounting portion 11c by die bonding. In the die bonding, a thermoplastic resin or a thermosetting resin, such as silicon resin, epoxy resin, melanin resin, or urea resin, may be used as an adhesive (paste). It is preferable to use silicon resin among the above-mentioned materials, in order to easily peel off the light-emitting device 2 from the mounting portion 11c of the lead frame 3. Alternatively, an adhesive including an inorganic material, such as a silver filler or silica, or an organic filler may be used. For example, glass may be used to fix the light-emitting device 2 to the mounting portion 11c. It is preferable that the adhesive have a hardness that has no effect on the wire bonding after being hardened.

With the light-emitting device 2 being fixed to the mounting portion 11c, one end of the first bonding wire 14 is bonded to the first electrode pad 9, and the other end of the first bonding wire is bonded to the inside terminal 11a of the first electrode lead 11 by wire bonding. Similarly, one end of the second bonding wire 15 is bonded to the second electrode pad 10, and the other end of the second bonding wire 15 is bonded to the inside terminal 12a of the second electrode lead 12 by wire bonding.

In this way, the first electrode pad 9 and the inside terminal 11a of the first electrode lead 11 are electrically connected to each other by the first bonding wire 14, and the second electrode pad 10 and the second electrode lead 12 are electrically connected to each other by the second bonding wire 15.

Then, as represented by a solid line in FIG. 8, after the fixed light-emitting device 2 is detached from the mounting portion 11c of the lead frame 3, the light-emitting device 2 supported by the first bonding wire 14 and the second bonding wire 15 is lifted up to a predetermined height H.

Specifically, for example, a spatula-shaped plate is used to press the side surface of the light-emitting device 2, and the light-emitting device 2 is peeled off from the paste to detach the light-emitting device 2 from the mounting portion 11c of the lead frame 3. For example, a hook-shaped tool can be used to lift up the first bonding wire 14 and the second bonding wire 15, thereby lifting the light-emitting device 2 up to a predetermined height H.

As such, it is possible to lift the light-emitting device 2 supported by the first bonding wire 14 and the second bonding wire 15 up to a height H where light emitted from the surface of the light-emitting device 2 facing the lead frame 3 can be most effectively reflected from the lead frame 3.

The predetermined height H means a gap H between the light-emitting device 2 and the lead frame 3 shown in FIG. 2 where light emitted from the surface of the light-emitting device 2 facing the lead frame 3 can be most effectively reflected from the lead frame 3. As described above, it is preferable that the gap H be greater than or equal to the thickness of the light-emitting device 2. Specifically, it is preferable that the gap H be in the range of 0.1 mm to 0.6 mm.

The concave portion 4a of the package 4 is filled with the sealing resin 16. In this way, it is possible to firmly fix the light-emitting device 2 to the package 4. Finally, the frame plate 20 is divided into individual light-emitting apparatuses 1. In this way, it is possible to collectively manufacture a plurality of light-emitting apparatuses 1.

In the method of manufacturing the light-emitting apparatus 1 according to this embodiment of the present invention, as described above, the light-emitting device 2 is fixed to the lead frame 3 by die bonding, and the first bonding wire 14 and the second bonding wire 15 are used to perform wire bonding between the first and second electrode pads 9 and 10 and the first and second electrode leads 11 and 12, respectively. Then, the fixed light-emitting device 2 is detached from the lead frame 3 with a gap H between the lead frame 3 and the surface of the light-emitting device 2 facing the lead frame 3.

Therefore, according to this manufacturing method, it is possible to manufacture the light-emitting apparatus 1 capable of reflecting a large amount of light emitted from the surface of the light-emitting device 2 facing the lead frame 3 from the lead frame 3 without shielding the light. In addition, in the light-emitting apparatus 1 fabricated by the manufacturing method, it is possible to effectively use light emitted from the surface of the light-emitting device 2 facing the lead frame 3. Therefore, it is possible to improve the utilization efficiency of light emitted from the light-emitting device 2. As a result, it is possible to improve the brightness and reduce power consumption.

Second Embodiment

Figure 9:
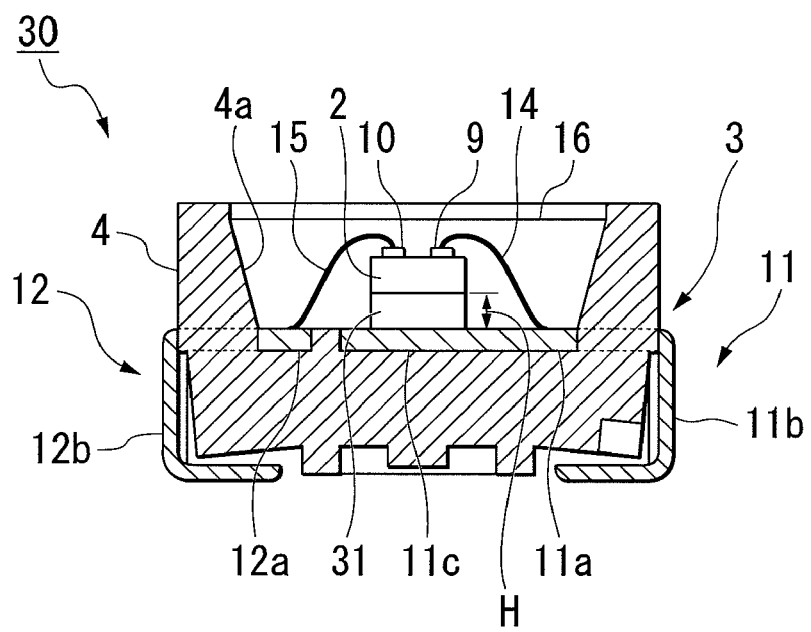
FIG. 9 is a cross-sectional view illustrating a light-emitting apparatus according to a second embodiment of the present invention.

Next, a light-emitting apparatus 30 according to a second embodiment will be described with reference to FIG. 9.

In the following description, the same components as those in the light-emitting apparatus 1 are denoted by the same reference numerals, and a description thereof will be omitted.

The light-emitting apparatus 30 has a structure in which a spacer 31 is provided between the light-emitting device 2 and the lead frame 3, instead of lifting the light-emitting device 2 supported by the first bonding wire 14 and the second bonding wire 15 up to a predetermined height H.

The spacer 31 is formed of a material that transmits light emitted from the light-emitting device 2, such as, glass, quartz, sapphire, or SiC. It is preferable to select a material allowing the refractive index of the spacer 31 to be substantially equal to that of the light-emitting device 2 from the above-mentioned materials.

The thickness H of the spacer 31 is set to a value capable of most effectively reflecting light emitted from the surface of the light-emitting device 2 facing the lead frame 3 from the lead frame 3. Specifically, it is preferable that the thickness H be greater than or equal to the thickness of the light-emitting device 2. In addition, the thickness is preferably greater than or equal to half the depth of the concave portion 4a of the package 4, and it is preferable to arrange the light-emitting device 2 at the focus of an emission surface on which the concave portion 4a of the package 4 is formed. The upper limit of the thickness H is preferably set such that the light-emitting device 2 does not protrude from the concave portion 4a of the package 4. Specifically, it is preferable that the thickness H be in the range of 0.1 mm to 0.6 mm.

The spacer 31 may be formed such that the size thereof in plan view is greater than or equal to that of the light-emitting device 2. A process of diffusing light emitted from the light-emitting device 2 may be performed on the spacer 31.

In the light-emitting apparatus 30, the spacer 31 may include a phosphor. In this case, it is possible to emit light having a different color from that of light emitted from the light-emitting device 2. For example, it is possible to obtain white light by the combination of a blue LED and a yellow phosphor.

In the light-emitting apparatus 30 according to this embodiment of the present invention, the spacer 31 provided between the light-emitting device 2 and the lead frame 3 makes it possible to arrange the light-emitting device 2 with a gap H between the lead frame 3 and the surface of the light-emitting device 2 facing the lead frame. In addition, since the spacer 31 is formed of a material transmitting light emitted from the light-emitting device 2, it is possible to reflect a large amount of light emitted from the surface of the light-emitting device 2 facing the lead frame 3 from the lead frame 3 without shielding the light.

Therefore, the light-emitting apparatus 30 can effectively use light emitted from the surface of the light-emitting device 2 facing the lead frame 3, and it is possible to improve the utilization efficiency of light emitted from the light-emitting device 2. As a result, it is possible to improve the brightness and reduce power consumption.

Next, a method of manufacturing the light-emitting apparatus 30 will be described.

A description of the same processes as those in the method of manufacturing the light-emitting apparatus 1 will be omitted.

In the method of manufacturing the light-emitting apparatus 30, after the processes shown in FIGS. 6 and 7, the spacer 31 is fixed to a portion of the frame plate 20 corresponding to the mounting portion 11c by an adhesive. Specifically, an adhesive (paste) is applied on the mounting portion 11c by, for example, a dispenser and the spacer 31 is arranged on the adhesive by, for example, a mounter. Then, the adhesive is hardened to fix the spacer 31 to the mounting portion 11c of the lead frame 3. For example, a thermoplastic resin or a thermosetting resin, such as silicon resin, epoxy resin, melanin resin, or urea resin, may be used as the adhesive (paste).

Then, the light-emitting device 2 is fixed to the spacer 31 by die bonding. In the die bonding, a thermoplastic resin or a thermosetting resin, such as silicon resin, epoxy resin, melanin resin, or urea resin, may be used as the adhesive (paste). Alternatively, an adhesive including an inorganic material, such as a silver filler or silica, or an organic filler may be used. For example, glass may be used to fix the light-emitting device 2 to the spacer 31. It is preferable that the adhesive have a hardness that has no effect on the wire bonding after being hardened.

With the light-emitting device 2 being fixed to the spacer 31, one end of the first bonding wire 14 is bonded to the first electrode pad 9, and the other end of the first bonding wire is bonded to the inside terminal 11a of the first electrode lead 11 by wire bonding. Similarly, one end of the second bonding wire 15 is bonded to the second electrode pad 10, and the other end of the second bonding wire 15 is bonded to the inside terminal 12a of the second electrode lead 12 by wire bonding.

In this way, the first electrode pad 9 and the inside terminal 11a of the first electrode lead 11 are electrically connected to each other by the first bonding wire 14, and the second electrode pad 10 and the second electrode lead 12 are electrically connected to each other by the second bonding wire 15.

In the light-emitting apparatus 30 according to this embodiment, as described above, the spacer 31 transmitting light emitted from the light-emitting device 2 is provided on the lead frame 3, and the light-emitting device 2 is fixed to the spacer 31 by die bonding. Then, the first bonding wire 14 and the second bonding wire 15 are used to perform wire bonding between the first and second electrode pads 9 and 10 and the first and second electrode leads 11 and 12, respectively. In this way, it is possible to provide the light-emitting device 2 with the gap H between the lead frame 3 and the surface of the light-emitting device 2 facing the lead frame 3.

Therefore, according to this manufacturing method, since the spacer 31 transmits light emitted from the light-emitting device 2, it is possible to manufacture the light-emitting apparatus 30 capable of reflecting a large amount of light emitted from the surface of the light-emitting device 2 facing the lead frame 3 from the lead frame 3, without shielding the light. Therefore, the light-emitting apparatus 30 fabricated by the above-mentioned manufacturing method can effectively use light emitted from the surface of the light-emitting device 2 facing the lead frame 3, and it is possible to improve the utilization efficiency of light emitted from the light-emitting device 2. As a result, it is possible to improve the brightness and reduce power consumption.

The light-emitting apparatus according to this embodiment of the present invention is not limited to a chip type in which the light-emitting device 2 is arranged in the package 4. For example, the light-emitting apparatus may be a bomb type in which the light-emitting device 2 is sealed with resin, or it may include a plurality of light-emitting devices 2.

EXAMPLES

Next, Examples according to the present invention will be described in order to make the effects of the present invention clear. However, the present invention is not limited to the following Examples, but various modifications and changes of the present invention can be made without departing from the scope and spirit of the present invention.

Example 1

In Example 1, an n-type semiconductor layer made of GaN, a light-emitting layer made of InGaN, and a p-type semiconductor layer made of AlGaN were sequentially formed on a sapphire substrate by a MOCVD method to manufacture a blue LED chip as a light-emitting device.

Then, a frame plate was prepared, and a portion of the frame plate corresponding to the lead frame was molded with polyphthalamide resin to form a package.

The blue LED chip was fixed to the lead frame by die bonding using an adhesive made of a silicon resin, and the electrode pads of the blue LED chip were wire-bonded to the electrode leads of the lead frame by Au bonding wires.

Then, the fixed blue LED chip was detached from the lead frame, and then the blue LED chip supported by the bonding wires was lifted up to a height of 0.15 mm.

Then, the concave portion of the package in which the blue LED chip was arranged was sealed with a silicon sealing resin, and the frame plate was cut to obtain the light-emitting apparatus according to the present invention.

The manufactured light-emitting apparatus had a size of, for example, 3.5 mm×2.8 mm×1.8 mm.

Comparative Example 1

In Comparative example 1, the same blue LED chip as that in Example 1 was used as a light-emitting device.

Then, the same frame plate as that in Example 1 was prepared, and a portion of the frame plate corresponding to the lead frame was molded with a polyphthalamide resin to form a package.

Then, the blue LED chip was fixed to the lead frame by die bonding using an adhesive made of a silicon resin, and the electrode pads of the blue LED chip were wire-bonded to the electrode leads of the lead frame by Au bonding wires.

Then, the concave portion of the package in which the blue LED chip was arranged was sealed with a silicon sealing resin, and the frame plate was cut to obtain the light-emitting apparatus according to the related art. The manufactured light-emitting apparatus had a size of, for example, 3.5 mm×2.8 mm×1.8 mm.

Figure 10:
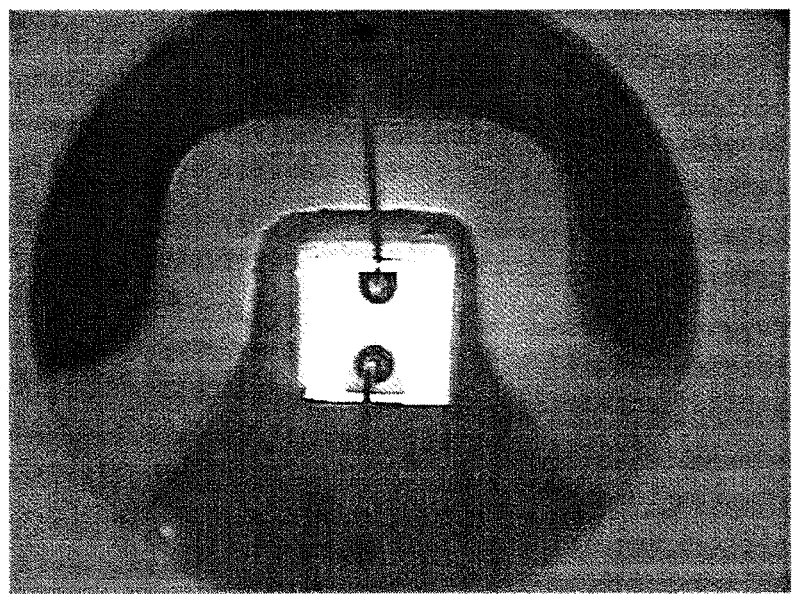
FIG. 10 is an enlarged photograph illustrating the emission state of a light-emitting apparatus according to Example 1.
Figure 11:
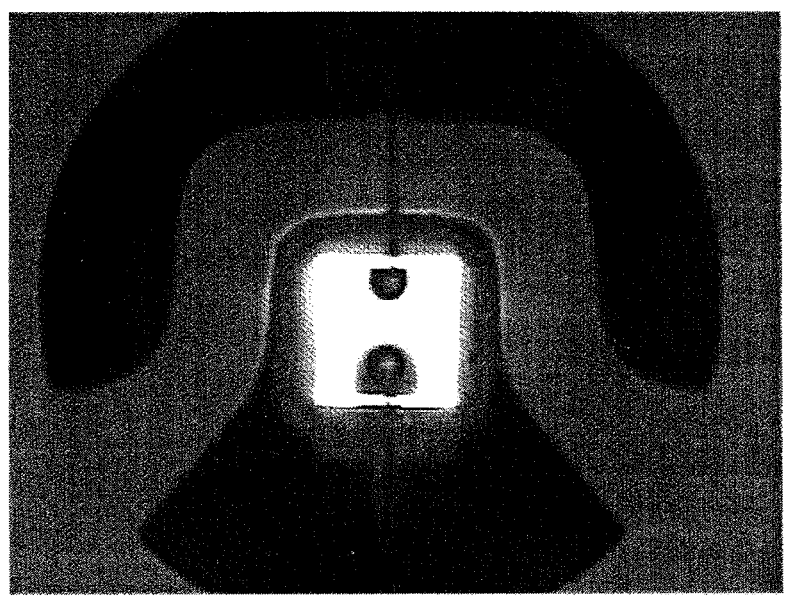
FIG. 11 is an enlarged photograph illustrating the emission state of a light-emitting apparatus according to Comparative example 1.

FIGS. 10 and 11 show enlarged photographs when the light-emitting apparatuses according to Example 1 and Comparative example 1 are supplied with the same power and emit light, respectively.

As can be seen from the enlarged photographs shown in FIGS. 10 and 11, light emitted from the light-emitting apparatus according to Example 1 shown in FIG. 10 is brighter than light emitted from the light-emitting apparatus according to Comparative example 1 shown in FIG. 11, and the light-emitting apparatus according to Example 1 effectively uses light emitted the blue LED chip. The reason is as follows. Since a thin sapphire substrate transmitting light emitted from the blue LED chip is used and the emission center of the blue LED chip fixed to the lead frame is lower than the focus of the emission surface of the concave portion in the light-emitting apparatus according to Comparative example 1, it is difficult for the light-emitting apparatus to effectively focus light emitted from the blue LED chip on the surface of the blue LED chip opposite to the lead frame. In contrast, in the light-emitting apparatus according to Example 1, since the blue LED chip is lifted from the lead frame, it is possible to align the emission center of the blue LED chip with the focus of the emission surface of the concave portion, and thus it is possible to effectively focus light emitted from the blue LED chip on the surface of the blue LED chip opposite to the lead frame.

In this way, the light-emitting apparatus according to the present invention can reduce the power required to obtain the same brightness. As a result, it is possible to reduce power consumption.

Industrial Applicability

The present invention can be applied to a light-emitting apparatus using a light-emitting device, such as a light emitting diode (LED), and a method of manufacturing the same.

The invention claimed is:

1. A light-emitting apparatus comprising:
   a light-emitting device including electrode pads; and
   a lead frame including electrode leads,
   wherein the electrode pads and the electrode leads are electrically connected to each other by bonding wires,
   the height of the surface of the electrode lead is equivalent to the height of the surface of the lead frame,
   the light-emitting device is arranged above the lead frame and the electrode leads, interposing a gap in the range of from 0.1 mm to 0.6 mm therebetween, and
   a package that holds the lead frame to which the light-emitting device is mounted, wherein the package has a concave portion having a shape whose diameter is increased from the bottom to an upper open portion, such that at least a part of the light-emitting device and of the lead frame are exposed from the concave portion,
   wherein the gap between the light emitting device and the lead frame and electrode leads is a void space.

2. The light-emitting apparatus according to claim 1, wherein the bonding wires support the light-emitting device to be lifted from the lead frame.

3. The light-emitting apparatus according to claim 1, wherein the light-emitting device includes a compound semiconductor obtained by sequentially laminating an n-type semiconductor layer, a light-emitting layer, and a p-type semiconductor layer on a substrate, and
   a first electrode pad connected to the n-type semiconductor layer and a second electrode pad connected to the p-type semiconductor layer are provided on one surface of the light-emitting device that is opposite to the lead frame.

4. The light-emitting apparatus according to claim 3, wherein the lead frame includes a first electrode lead and a second electrode lead,
   the first electrode pad and the first electrode lead are electrically connected to each other by a first bonding wire, and the second electrode pad and the second electrode lead are electrically connected to each other by a second bonding wire, and
   a direction from a contact point between the first bonding wire and the first electrode pad to a contact point between the first bonding wire and the first electrode lead is opposite to a direction from a contact point between the second bonding wire and the second electrode pad and a contact point between the second bonding wire and the second electrode lead.

5. A method of manufacturing a light-emitting apparatus comprising a light-emitting device having electrode pads and a lead frame including electrode leads, wherein the electrode pads and the electrode leads are electrically connected to each other by bonding wires, the height of the surface of the electrode lead is equivalent to the height of the surface of the lead frame, the light-emitting device is arranged above the lead frame and the electrode leads, interposing a gap in the range of from 0.1 mm to 0.6 mm therebetween, and
   a package that holds the lead frame to which the light-emitting device is mounted, wherein the package has a concave portion having a shape whose diameter is increased from the bottom to an upper open portion, such that at least a part of the light-emitting device and of the lead frame are exposed from the concave portion,
   wherein the gap between the light emitting device and the lead frame and electrode leads is a void space,
   the method comprising:
   fixing the light-emitting device to the lead frame;
   electrically connecting the electrode pads and the electrode leads using the bonding wires; and
   detaching the fixed light-emitting device from the lead frame.

6. The method of manufacturing a light-emitting apparatus according to claim 5, further comprising:
   after detaching the light-emitting device from the lead frame, lifting the light-emitting device supported by the bonding wires up to a predetermined height.

* * * * *